(12) United States Patent
Jelks

(10) Patent No.: US 6,307,655 B1
(45) Date of Patent: Oct. 23, 2001

(54) WIDEBAND FREQUENCY ANALYZER EMPLOYING OPTICAL CHIRP TRANSFORM

(75) Inventor: Edward Christian Jelks, Englewood, CO (US)

(73) Assignee: Lockhead Martin Corporation, Bethesda, MD (US)

(*) Notice: Subject to any disclaimer, the term of this patent is extended or adjusted under 35 U.S.C. 154(b) by 0 days.

(21) Appl. No.: 09/433,779

(22) Filed: Nov. 3, 1999

(51) Int. Cl.$^7$ .................................................... H04J 14/02
(52) U.S. Cl. .......................................... 359/124; 359/110
(58) Field of Search ........................... 359/109–110, 111, 359/112, 113, 114, 115, 116, 117, 118, 119, 120–195; 385/15, 27, 39; 324/76.19, 76.36

(56) References Cited

U.S. PATENT DOCUMENTS

| | | | |
|---|---|---|---|
| 4,456,877 | * 6/1984 | Brown | 324/77 K |
| 5,077,816 | 12/1991 | Glomb et al. | 385/37 |
| 5,079,735 | 1/1992 | Apostolos | 364/827 |
| 5,233,187 | 8/1993 | Sakata et al. | 250/227 |
| 5,343,207 | 8/1994 | Stromswold et al. | 342/192 |
| 5,394,153 | 2/1995 | Borofka | 342/20 |
| 5,513,913 | 5/1996 | Ball et al. | 374/120 |

OTHER PUBLICATIONS

"Coherent Optical Fibre Delay–Line Processor", Jackson, et al., Electronics Letters, vol. 22, No. 25, Dec. 4, 1986.

"1Gbit/s code generator and matched filter using an optical fiber tapped delay line", Jackson, et al., Applied Physics Letters, vol. 42, No. 7, Apr. 1, 1983.

"High Temperature Superconductive Wideband Compressive Receivers", Lyons, et al., IEEE Transactions on Microwave Theory and Techniques, vol. 44, No. 7, Jul. 1996.

"Optical Fiber Delay–Line Signal Processing", Jackson, et al., IEEE Transactions on Microwave Theory and Techniques, vol. MTT–33, No. 3, Mar. 1985.

* cited by examiner

Primary Examiner—Georgia Epps
Assistant Examiner—Tuyen Tra
(74) Attorney, Agent, or Firm—Marsh Fischmann & Breyfogle LLP

(57) ABSTRACT

A wideband frequency analyzer and method of performing spectral analysis of a wideband signal is provided. The wideband frequency analyzer includes a first electro-optic modulator, a second electro-optic modulator, and an optical transversal filter. The first electro-optic modulator is operable to modulate an electrical input signal, such as a wideband radio-frequency signal, onto an optical carrier signal to output a modulated optical signal. The second electro-optic modulator is operable to mix the modulated optical signal with an electrical chirp signal to output a chirped modulated optical signal. The optical transversal filter is operable to filter the chirped modulated optical signal to output an electrical output signal. A method of performing spectral analysis of a wideband signal includes the step of modulating the wideband signal onto an optical carrier signal to generate a modulated optical signal. The modulated optical signal is then mixed with a chirp signal to generate a chirped modulated optical signal. The chirped modulated optical signal is then filtered to generate an electrical output signal representative of the amplitude of the Fourier transform of the electrical input signal.

29 Claims, 10 Drawing Sheets

WIDEBAND FREQUENCY ANALYZER EMPLOYING OPTICAL CHIRP TRANSFORM

TECHNICAL FIELD OF THE INVENTION

The present invention relates generally to the field of signal processing, and more particularly to wideband spectral analysis using an optically implemented chirp transform.

BACKGROUND OF THE INVENTION

Wideband frequency analyzers may be used to analyze the spectral characteristics of a received electromagnetic signal. As a result, wideband frequency analyzers are useful in many different signal processing applications. For example, wideband frequency analyzers may be used in various types of communication systems, including satellite and microwave communication systems, radar systems, radar threat receiver systems, studio sound recording systems, and the like.

The analysis of a received electromagnetic signal generally includes determination of the frequency, or frequency band, associated with each signal, and may also include other signal characteristics, such as a transform function associated with the signal. Wideband frequency analyzers operate over a specific frequency range. The wideband frequency analyzer can detect and analyze any signal that has a frequency within the frequency range of the wideband frequency analyzer.

In multi-signal applications, the wideband frequency analyzer may receive a broadband signal that comprises multiple individual signals that are received simultaneously. Using the wideband frequency analyzer, the characteristics of each signal within the broadband signal may be analyzed. In particular, each signal within the broadband signal has a specific frequency, or frequency band, associated with the respective signal. For example, a communication system may utilize a broadband signal that contains hundreds or thousands of individual signals, with each individual signal comprising, for example, a data stream for a number of phone calls.

One important technique for accomplishing wideband spectral analysis employs transversal filters to implement the chirp transform. Typical wideband frequency analyzers implement the chirp transform with transversal filters built using either surface acoustic wave (SAW) devices or tapped, superconducting delay lines. Such wideband frequency analyzers have a limited frequency detection range. In particular, conventional SAW device wideband frequency analyzers are generally limited to a frequency bandwidth on the order of 500 MHZ. Conventional high temperature superconducting (HTS) tapped delay line wideband frequency analyzers are generally limited to a frequency bandwidth on the order of 4 Ghz. Further, conventional HTS device wideband frequency analyzers also have limited frequency resolution capabilities due to limitations on the filter delay times achievable with such devices. For example, conventional HTS device wideband frequency analyzers are generally limited to a frequency resolution on the order of 25 MHZ.

Many conventional wideband frequency analyzers also have a limited dynamic range that cannot be electronically adjusted. In particular, conventional SAW and HTS wideband frequency analyzers utilize fixed taps for apodization, i.e., amplitude weighting. The fixed taps do not allow the apodization to be electronically corrected to correct for signal irregularities, such as chirp and other non-linearities.

SUMMARY OF THE INVENTION

Accordingly, a need has arisen for an improved wideband frequency analyzer and method of performing wideband spectral analysis. The present invention discloses a wideband frequency analyzer and method of performing wideband spectral analysis that employs an optically implemented chirp transform to achieve multi-gigahertz bandwidths, fine frequency resolution, and electronically adjustable apodization.

According to one aspect of the present invention a wideband frequency analyzer includes a first electro-optic modulator, a second electro-optic modulator, and an optical transversal filter. The first electro-optic modulator is operable to modulate an electrical input signal, such as a wideband radio-frequency signal, onto an optical carrier signal to output a modulated optical signal. The second electro-optic modulator is operable to mix the modulated optical signal with an electrical chirp signal to output a chirped modulated optical signal. The optical transversal filter is operable to filter the chirped modulated optical signal to output an electrical output signal. The electrical signal output by the optical transversal filter represents the amplitude of the Fourier transform of the input signal. The first and second electro-optic modulators may comprise Mach-Zehnder modulators. The wideband frequency analyzer may further include an optical signal source such as, for example a laser, that supplies the optical carrier signal to the first electro-optic modulator and a chirp signal source that supplies the chirp signal to the second electro-optic modulator.

The optical transversal filter may comprise a tapped optical fiber delay line having a plurality of taps spaced apart from one another along the optical fiber delay line. The optical fiber delay line may comprise a single mode optical fiber. The taps may comprise fiber 1% (nominal) couplers, and each tap obtains a sample of the chirped modulated optical signal after a period of delay corresponding to the location of the tap along the optical fiber delay line. The taps are spaced apart from one another along the optical fiber delay line to sample the chirped modulated optical signal in such a way so as to act as a matched filter. In this regard, the spacing between successive taps along the optical fiber delay line may correspond to the positive and negative half-wave positions of the modulation envelope of the chirp signal modulated on the optical carrier signal.

The taps direct the samples to optical detectors that convert the samples to electrical signals comprising the output signal. The optical detectors may comprise PIN diodes that are reverse biased. There may be a separate optical detector associated with each tap. Electrical signals from the detectors associated with the first, third, fifth, etc. taps along the optical fiber delay line may be summed to produce a positive output signal. Likewise, the electrical signals from the detectors associated with the second, fourth, sixth, etc. taps along the optical fiber delay line may be summed to produce a negative output signal. The positive and negative output signals may then be summed to produce the output signal of the wideband frequency analyzer. However, if the phase coherence of the chirped modulated optical signal can be spoiled, only two optical detectors are necessary. One optical detector receives samples from the first, third, fifth, etc. taps and the other optical detector receives samples from the second, fourth, sixth, etc. taps.

The optical transversal filter may also comprise a branched optical fiber delay line including a plurality of optical branches. The chirped modulated optical signal is split among the optical branches to obtain samples of the chirped modulated optical signal at the ends of each optical branch after a period of delay corresponding to the length of each optical branch. Optical detectors disposed at the end of each branch receive the delayed samples of the chirped modulated optical signal from the ends of the optical branches and convert the samples to electrical signals comprising the output signal.

According to another aspect of the present invention, a wideband frequency analyzer includes an electrical signal mixer, an electro-optic modulator, and an optical transversal filter. The electrical signal mixer is operable to mix an electrical input signal, such as a wideband radio-frequency signal, with an electrical chirp signal to output a chirped input signal. The electro-optic modulator is operable to modulate the chirped input signal onto an optical carrier signal to output a chirped modulated optical signal. The optical transversal filter is operable to filter the chirped modulated optical signal to output an electrical output signal representing the amplitude of the Fourier transform of the input signal. The wideband frequency analyzer may further include an optical signal source such as, for example a laser, that supplies the optical carrier signal to the electro-optic modulator and a chirp signal source that supplies the chirp signal to the electrical signal mixer.

According to one more aspect of the present invention, a method of performing spectral analysis of a wideband signal includes the step of modulating the wideband signal onto an optical carrier signal to generate a modulated optical signal. The modulated optical signal is then mixed with a chirp signal to generate a chirped modulated optical signal. The chirped modulated optical signal is then filtered to generate an electrical output signal representative of the amplitude of the Fourier transform of the electrical input signal. The step of modulating may include the steps of supplying an optical carrier signal to an optical input of an electro-optic modulator, receiving the wideband signal on an electrical input of the electro-optic modulator, and operating the electro-optic modulator to output the modulated optical signal on an optical output of the electro-optic modulator. The step of mixing may include the steps of supplying an electrical chirp signal to an electrical input of an electro-optic modulator, receiving the modulated optical signal on an optical input of the electro-optic modulator, and operating the electro-optic modulator to output the chirped modulated optical signal on an optical output of the electro-optic modulator. The step of filtering may include the steps of transmitting the chirped modulated optical signal through an optical fiber delay line, sampling the chirped modulated optical signal at various locations along the optical fiber delay line to obtain samples of the chirped modulated optical signal, and converting the samples of the chirped modulated optical signal to electrical signals with optical detectors.

One advantage of the present invention is that the signal carrying capacity of the optical fiber delay line of the optical transversal filter permits very broad bandwidth signals of 1 to 10 GHz or more to be analyzed. The present invention also allows for fine frequency resolution, on the order of 1 to 30 Mhz, due to the ease with which the optical fiber delay line may be lengthened without incurring significant signal losses. Further, dynamic range may be maximized through electronically adjustable apodization because the optical/electrical interface between the optical fiber delay line and the optical detectors may be accessed for amplitude weighting.

These and other aspects and advantages of the present invention will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like referenced numerals represent like parts, in which.

DETAILED DESCRIPTION OF THE INVENTION

Figure 1:
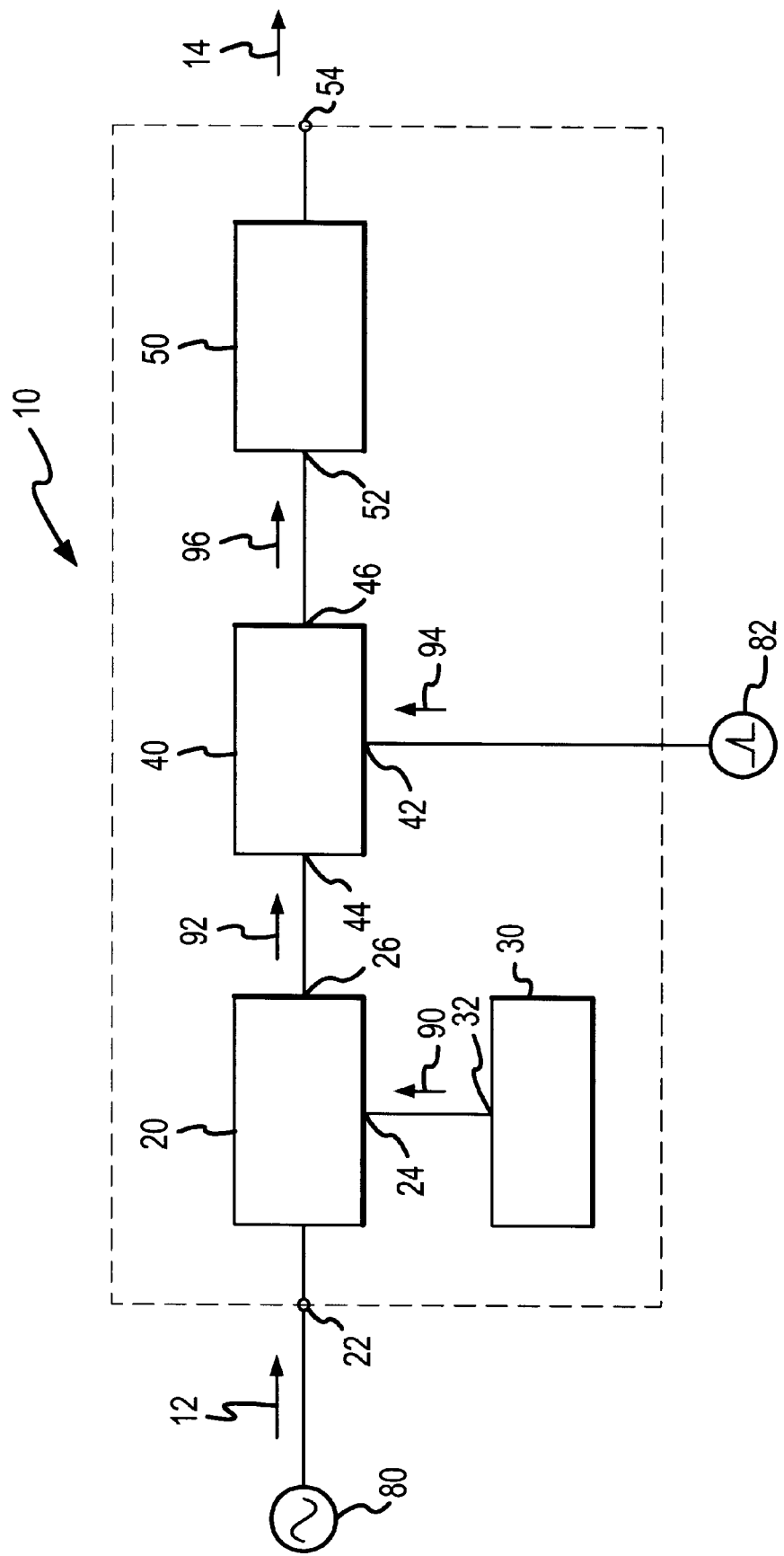
FIG. 1 is a schematic diagram of one embodiment of a wideband frequency analyzer in accordance with the present invention.

Referring now to FIG. 1, there is shown a schematic diagram of one embodiment of a wideband frequency analyzer 10 in accordance with the present invention. The wideband frequency analyzer 10 includes a first electro-optic modulator 20, an optical signal source 30 (e.g. a laser), a second electro-optic modulator 40, and an optical transversal filter 50. The wideband frequency analyzer 10 receives an electrical input signal 12 on an electrical input 22 of the first electro-optic modulator 20 and outputs an electrical output signal 14 on an electrical output 54 of the optical transversal filter 50. The output signal 14 is representative of the amplitude of the Fourier transform of the input signal 12. The output signal 14 produced by the wideband frequency analyzer 10 thus provides an indication of the spectral content of the input signal 12. The input signal 12 may comprise a wideband RF signal including a plurality of signals of differing frequencies that is received from an RF signal source 80. In this regard, the wideband frequency analyzer 10 may be understood to comprise a wideband compressive receiver.

The first electro-optic modulator 20 includes an electrical input 22, an optical input 24 and an optical output 26. The optical input 24 of the first electro-optic modulator 20 is optically connected (e.g. by an optical fiber) to an optical output 32 of the optical signal source 30. The first electro-optic modulator 20 may comprise a Mach-Zehnder modulator. The first electro-optic modulator 20 modulates the input signal 12 received on its electrical input 22 onto an optical carrier signal 90, supplied by the optical carrier signal source 30 to its optical input 24, to output a modulated optical signal 92 on its optical output 26.

The second electro-optic modulator 40 includes an electrical input 42 electrically connected (e.g. by a coaxial cable) to a chirp signal source 82, an optical input 44 optically connected to the optical output 26 of the first electro-optic modulator 20, and an optical output 46. The second electro-optic modulator 40 may comprise a Mach-Zehnder modulator. The second electro-optic modulator 40 receives the modulated optical signal 92 on its optical input 44 and mixes the modulated optical signal 92 with a chirp signal 94 received on its electrical input 42 from the chirp signal source 82 to output a modulated chirped optical signal 96 on its optical output 46.

The chirp signal 94 comprises a signal that increases in frequency from an initial value in a linear ramp-like fashion for some period of time then returns to the initial value before increasing again. The time duration of the chirp signal 94 supplied by the chirp signal source 82 is preferably twice the time duration of the longest delay provided by the optical transversal filter 50 that follows the second electro-optic modulator 40. Further, the bandwidth of the chirp signal 94 is preferably twice the bandwidth of the optical transversal filter 50. Additionally, the chirp signal 94 should also be of opposite frequency-versus-time slope to that of the optical transversal filter 50.

The optical transversal filter 50 includes an optical input 52 that is optically connected with the optical output 46 of the second electro-optic modulator 40 and an electrical output 54. As is described more fully below in connection with FIG. 2, the optical transversal filter 50 receives the modulated chirped optical signal 96 on its optical input 52 and filters the modulated chirped optical signal 96 to generate the output signal 14 on its electrical output 54.

Figure 2:
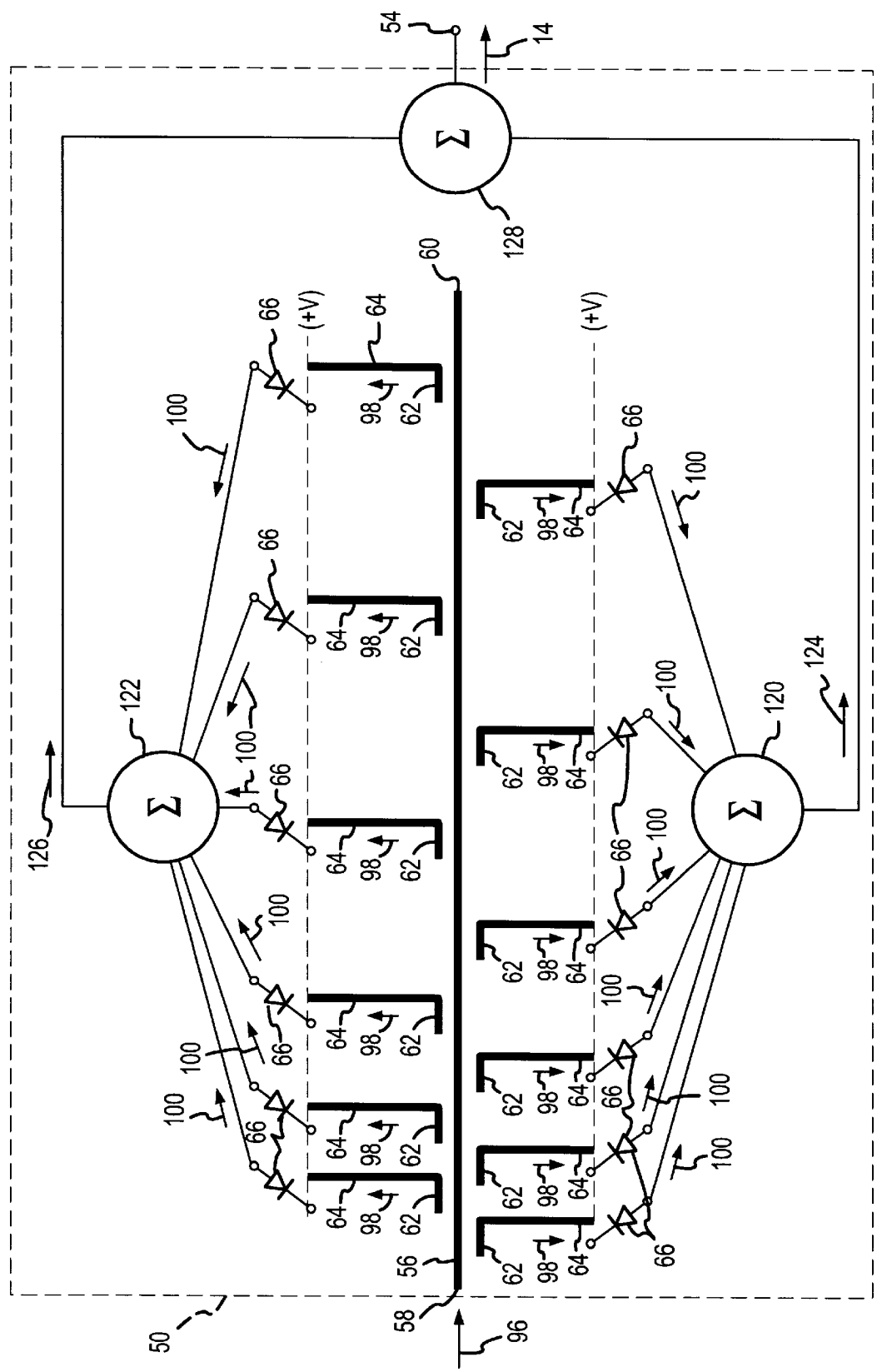
FIG. 2 is a schematic diagram of one embodiment of an optical transversal filter included in the wideband frequency analyzer of FIG. 1.

FIG. 2 shows schematic diagram of one embodiment of an optical transversal filter 50 employed in the wideband frequency analyzer 10 of FIG. 1. In the embodiment shown, the optical transversal filter 50 includes a tapped, optical fiber delay line 56. The modulated chirped optical signal 96 to be filtered is received at a first end 58 of the optical fiber delay line 56 and transmitted there through towards a second end 60 of the optical fiber delay line 56. The optical fiber delay line 56 may comprise a single mode optical fiber. A single mode optical fiber is preferred as opposed to a multi-mode optical fiber to eliminate multiple propagation paths through the fiber, and hence limit inconsistent delay times.

The optical fiber delay line 56 includes a plurality of optical taps 62. Although in FIG. 2 there are twelve taps 62 shown, it should be appreciated that there may be more or fewer taps 62, depending upon the requirements of the optical transversal filter 50. The optical taps 62 may comprise fiber 1% (nominal) couplers having fiber pigtails 64.

The taps 62 are spaced apart from one another along the optical fiber delay line 56 to sample the chirped modulated optical signal 96 in such a way so as to act as a matched filter. In this regard, the spacing between successive taps 62 along the optical fiber delay line 56 should correspond to the positive and negative half-wave positions of the modulation envelope of the chirp signal 94 modulated on the optical carrier signal 90. A typical example of tap 62 spacing is shown in FIG. 10.

Figure 10:
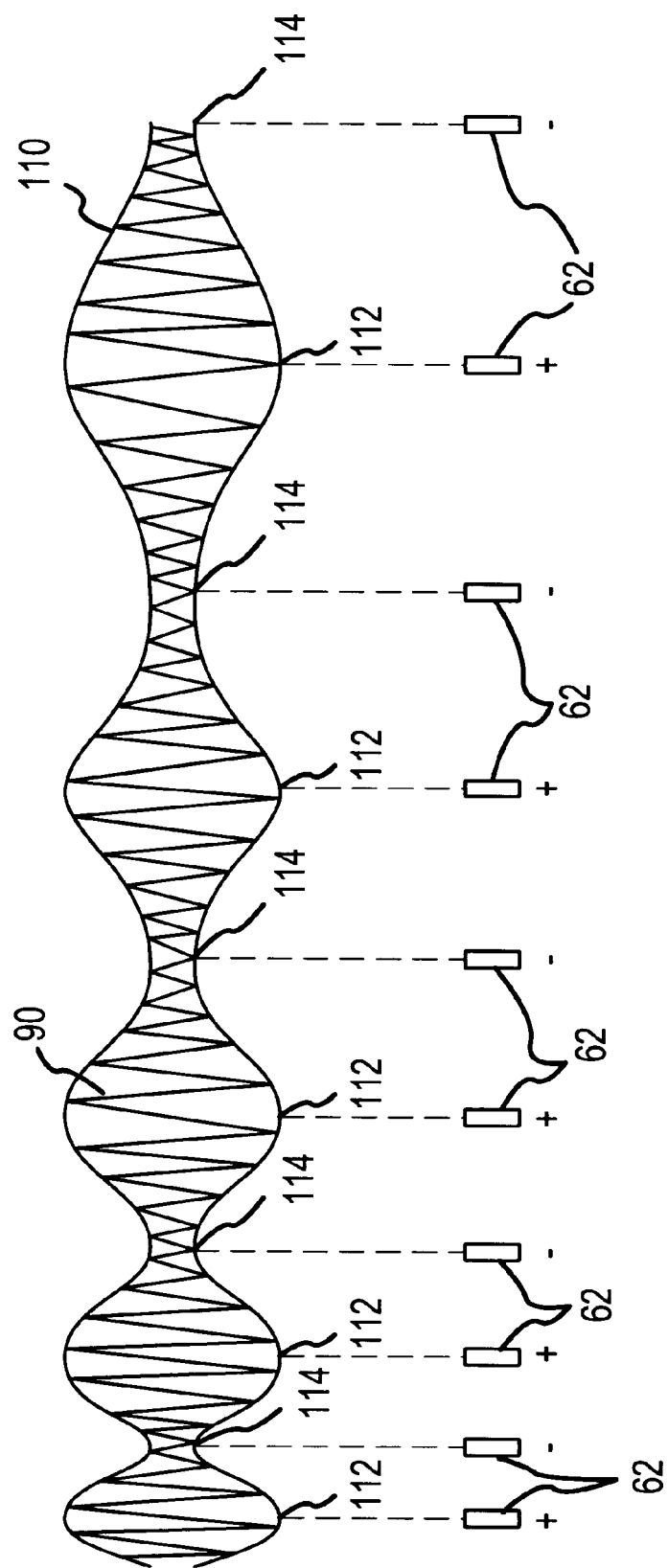
FIG. 10 is a plot showing an example of the correspondence between optical tap spacing and positive and negative half-wave positions of a chirp signal modulated on an optical carrier signal.

In FIG. 10, the modulation envelope 110 of the chirp signal 94 modulated on the optical carrier signal 90 is shown for a particular instant in time as it would be present in the optical fiber delay line 56 of the optical transversal filter 50. Successive taps 62 along the optical fiber delay line 56 are spaced apart from one another to coincide with the positive and negative half-wave positions 112, 114 of the modulation envelope 110 (i.e. the peaks and valleys of the modulation envelope 110). Thus, as the period between successive positive and negative half-wave positions 112, 114 increases so does the spacing between successive taps 56.

It may also be appreciated that such an arrangement achieves a discrete implementation of the continuous time Fourier transform:

$$H(\omega) = \int_{-\infty}^{\infty} h(\tau) e^{-i\omega\tau} d\tau$$

with a linear mapping of frequency to time:

$$\omega = \mu t$$

where $\mu$ is the slope of the chirp signal 94, resulting in the following relationship:

$$H(\mu t) = e^{-\frac{i\mu t^2}{2}} \int_{-\infty}^{\infty} \left( h(\tau) e^{-\frac{i\mu\tau^2}{2}} \right) e^{-\frac{i\mu(t-\tau)^2}{2}} d\tau$$

The optical taps 62 obtain samples 98 of the chirped modulated optical signal 96 from the optical fiber delay line 56. Each sample 98 is delayed by an amount of time corresponding the distance between the first end 58 of the optical fiber delay line 56 and the location of the tap 62 on the optical fiber delay line 56 that obtained such sample 98. As may be appreciated, the optical fiber delay line 56 permits long delay times for the samples 98 since a substantial length of optical fiber may be stored in a relatively compact space and the chirped modulated optical signal 96 is transmitted through the optical fiber comprising the optical fiber delay line 56 with limited power loss and minimal signal distortion.

The fiber pigtail 64 of each tap 62 directs its respective sample 98 to a separate optical detector 66 associated with the tap 62. The optical detectors 66 may comprise PIN diodes that are reverse biased by a positive bias voltage +V applied to the PIN cathode as is shown in FIG. 2. The optical detectors 66 are grouped into a positive row of detectors 66 and a negative row of detectors 66. The positive row of detectors 66 is comprised of the detector 66 associated with the tap 62 nearest the first end 58 of the optical fiber delay line 56 and the detectors 66 associated with every second subsequent tap 62 thereafter along the optical fiber delay line 56 (i.e. the first, third, fifth, etc. taps 62). The negative row of detectors 66 is comprised of the detector 66 associated with the tap 62 that is second nearest the first end 58 of the optical fiber delay line 56 and the detectors 66 associated with every second subsequent tap 62 thereafter along the optical fiber delay line 56 (i.e. the second, fourth, sixth, etc. taps 62). The detectors 66 of the positive row are connected to one another in a parallel fashion, and the detectors 66 of the negative row are likewise connected to one another in a parallel fashion. The optical detectors 66 of the positive and negative rows convert the optical samples 98 to electrical signals 100. The electrical signals 100 from the positive row of detectors 66 are summed with an electrical signal summer 120 to produce a positive output signal 124 and the electrical signals 100 from the negative row of detectors 66 are summed with an electrical signal summer 122 to produce a negative output signal 126. The positive and negative output signals 124, 126 from the summers 120, 122 are then summed with an electrical signal summer 128 to produce the output signal 14 of the wideband frequency analyzer 10. The output signal 14 represents the amplitude of the Fourier transform of the input signal 12.

With an optical transversal filter 50 such as described above, amplitude weighting of the taps 62 (e.g. Hamming weighting) to achieve a desired convolution performance of the optical transversal filter 50 may be implemented. One manner in which the taps 62 may be weighted is to apply different bias voltages to the PIN diodes comprising the optical detectors 66. Another possible manner in which amplitude weighting may be accomplished is to connect the anode of each PIN diode optical detector 66 to a separate amplifier, the gain of which may be controlled by, for example, applying different bias voltages to the separate amplifiers. As may be appreciated, amplitude weighting of the taps 62 may also be accomplished in other manners as well.

Figure 3:
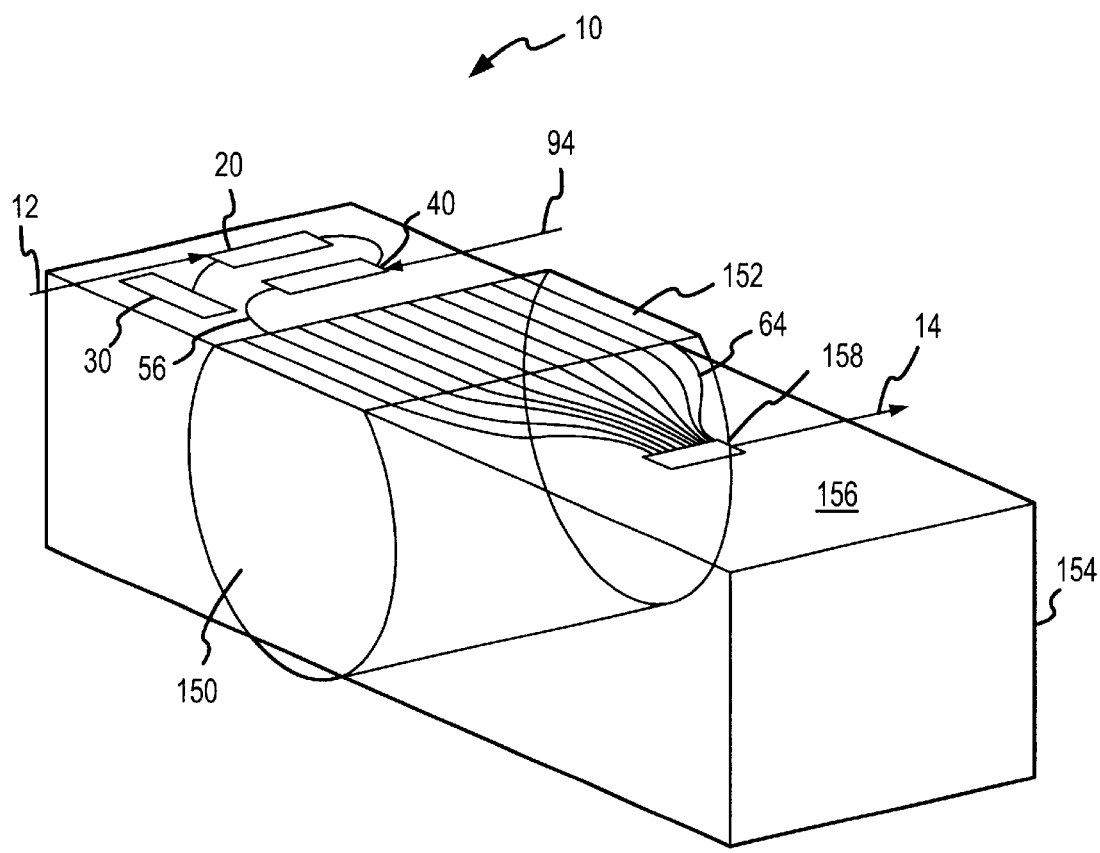
FIG. 3 is a perspective view of one manner in which the wideband frequency analyzer of FIG. 1 may be packaged.

FIG. 3 illustrates a perspective view of one manner in which the wideband frequency analyzer 10 of FIG. 1 may be packaged. The optical fiber delay line 56 of the optical transversal filter 50 may be wound around a cylindrical spool 150. The cylindrical spool 150 includes a one or more flat surfaces 152 to accommodate the optical taps 62. The cylindrical spool 150 may be attached to a structure 154 configured to provide a planar surface 156 upon which the first electro-optic modulator 20, the optical signal source 30, the second electro-optic modulator 40, and the optical detectors 66 are mounted. The optical detectors 66 may be arranged in an array (e.g. a PIN diode array) and interfaced with the fiber pigtails 64 of the taps 62 by means of a "V-groove" chip 158. It should be appreciated that the wideband frequency analyzer 10 of the present invention may also be packaged in other manners as well, and the packaging concept shown in FIG. 3 is only one possible example.

Figure 4:
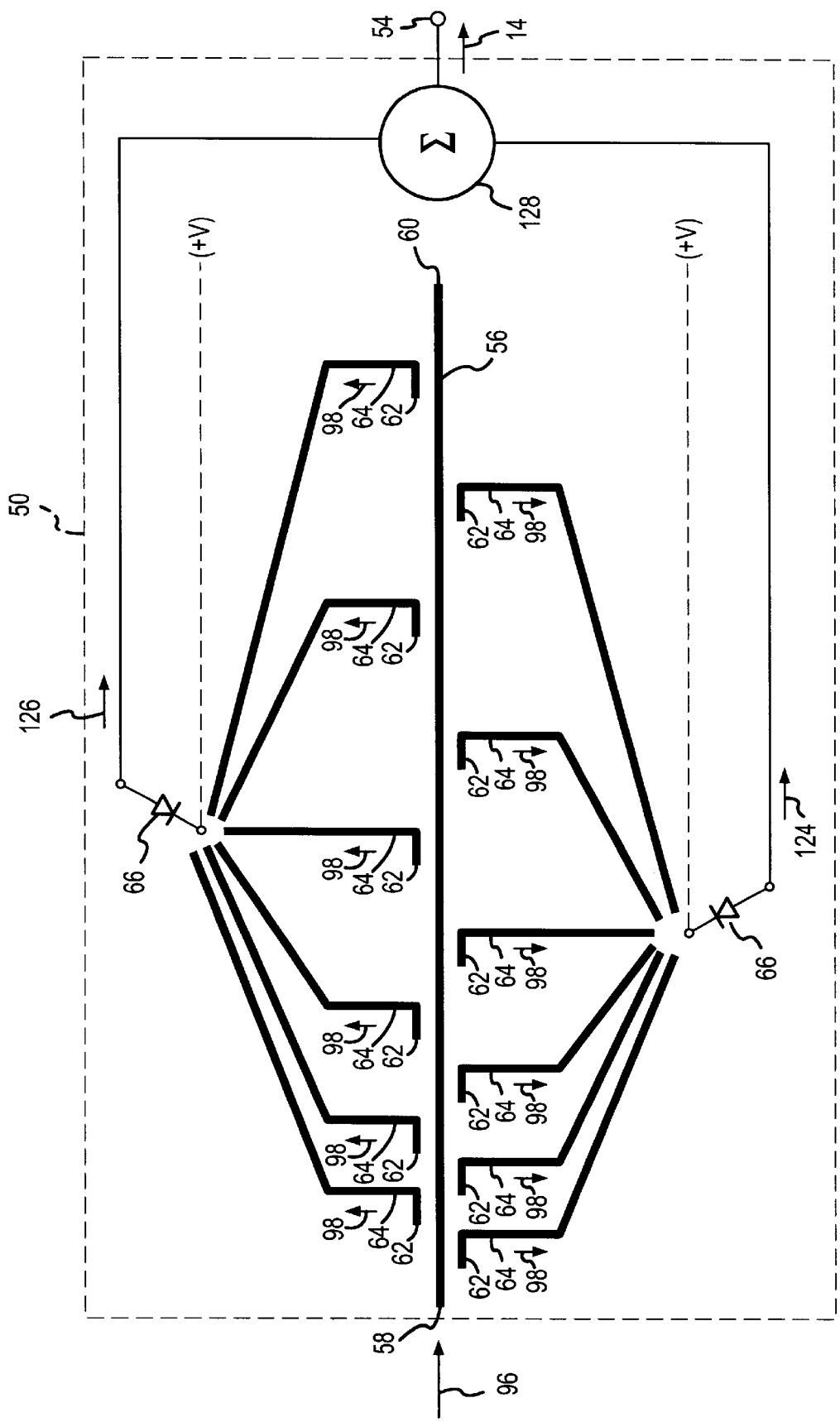
FIG. 4 is a schematic diagram of another embodiment of an optical transversal filter included in the wideband frequency analyzer of FIG. 1.

Referring now to FIG. 4, there is shown an alternative embodiment for the optical transversal filter 50 included in the wideband frequency analyzer 10 of FIG. 1. The optical transversal filter 50 is configured similar to that shown in FIG. 2. However, if the optical phase coherence of the chirped modulated optical signal 96 is spoiled, the optical transversal filter 50 need only include two optical detectors 66. One of the optical detectors 66 receives samples 98 obtained by the tap 62 nearest the first end 58 of the optical fiber delay line 56 and every second subsequent tap 62 thereafter. The other optical detector 66 receives samples 98 from the tap 62 second nearest the first end 58 of the optical fiber delay line 56 and every second subsequent tap 62 thereafter. Positive and negative output signals 124, 126 from the two detectors 66 are summed with an electrical signal summer 128 to produce the output signal 14. As with the embodiment of the optical transversal filter 50 illustrated in FIG. 2, the optical detectors 66 may comprise PIN diodes that are reverse biased by a positive bias voltage +V applied to the PIN cathode. Spoilation of the phase coherence may, for example, be accomplished by using an optical signal source 30 comprising multiple lasers, each operating at a different wavelength. The distinct wavelength signals from each of the lasers may be wavelength division multiplexed together to form the optical carrier signal 90 received by the optical input 24 of the first electro-optic modulator 20. Another approach to accomplishing spoilation of the phase coherence is to employ an optical phase modulator at the optical input 52 of the optical transversal filter 50 to vary the phase of the chirped modulated optical signal 96 at gigahertz rates.

Figure 5:
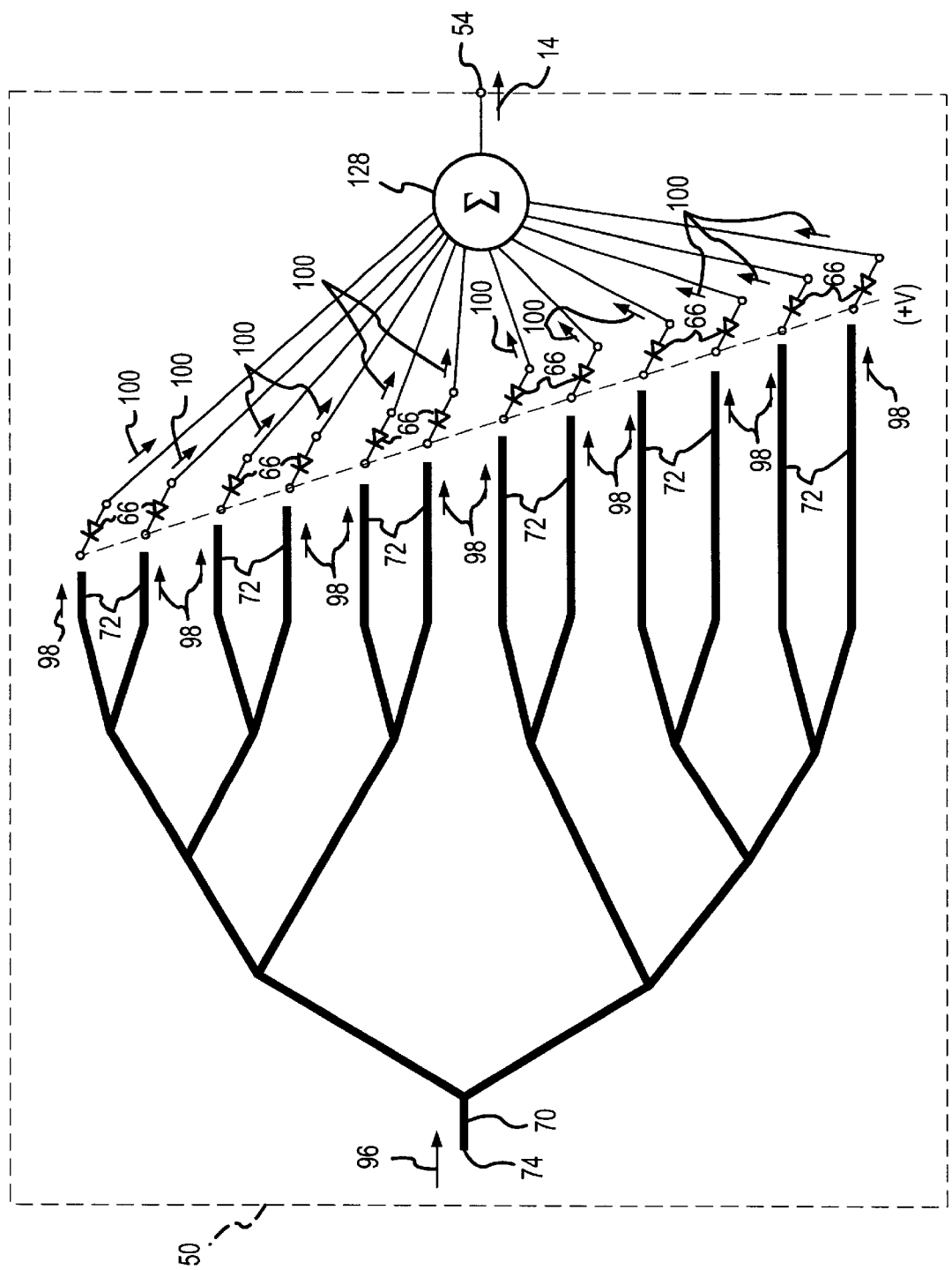
FIG. 5 is a schematic diagram of an alternative embodiment of an optical transversal filter included in the wideband frequency analyzer of FIG. 1.

Referring now to FIG. 5, another embodiment of the optical transversal filter 50 included in the wideband frequency analyzer 10 of FIG. 1 is shown. Rather than employing a tapped, optical fiber delay line 56, the transversal filter 50 of FIG. 5 includes a branched optical fiber delay line 70 having a plurality of optical branches 72. The chirped modulated optical signal 96 is received at a first end 74 of the branched optical fiber delay line 70 and is split (e.g. by optical fiber splitters) among the optical branches 72 and directed thereby to optical detectors 66 disposed at the end of each optical branch 72. As may be appreciated, each detector 66 thus receives a sample 98 of the chirped modulated optical signal 96 delayed by an amount of time corresponding to the length of its respective branch 72. The branches 72 may be configured to have lengths such that the delays obtained are the same as with the optical transversal filter 50 shown in FIG. 2. The detectors 66 convert the samples 98 to electrical signals 100 that are summed by an electrical signal summer 128 to produce the output signal 14.

In addition to their application in a wideband frequency analyzer 10 such as described above, it should be appreciated that optical transversal filters such as shown in FIGS. 2, 4 and 5 may also have applicability in other signal processing applications. In this regard, the optical branches 72 of an optical transversal filter 50 such as shown in FIG. 5 may have appropriate lengths or the taps 62 of an optical transversal filter 50 such as shown in FIGS. 2 and 4 may be spaced along the optical fiber delay line 56 in appropriate manners in order to achieve different filtering functions. For example, the taps 62 may be equally spaced apart from one another along the optical fiber delay line 56 in order to achieve bandpass filtering.

Figure 6:
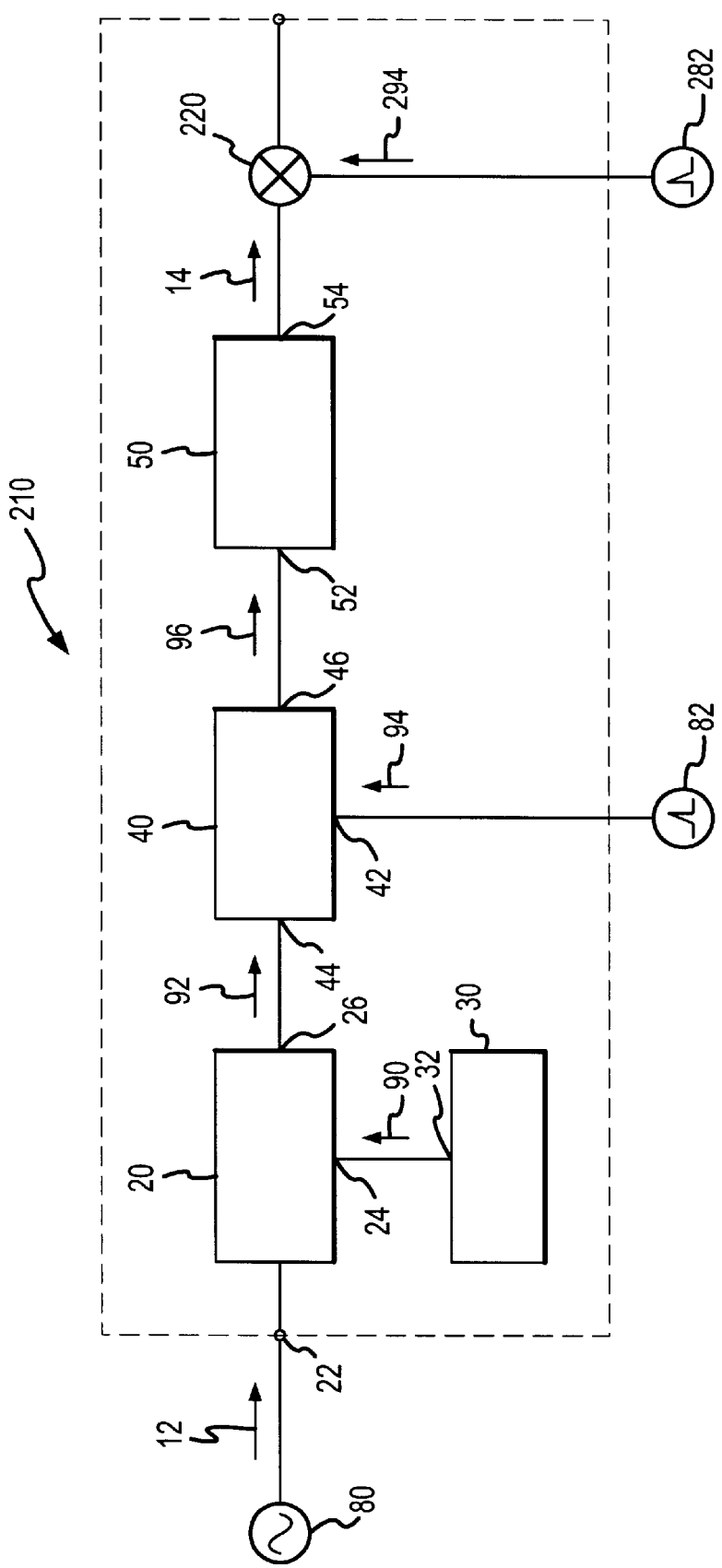
FIG. 6 is a schematic diagram of another embodiment of a wideband frequency analyzer in accordance with the present invention.

Referring now to FIG. 6, there is shown a schematic diagram of another embodiment of a wideband frequency analyzer 210 in accordance with the present invention. The wideband frequency analyzer 210 is configured to obtain phase and amplitude information about the Fourier transform of the input signal 12. The wideband frequency analyzer 210 shown in FIG. 6 includes an electrical signal mixer 220 connected to the output 54 of the optical transversal filter 50. The electrical signal mixer 220 receives the electrical output signal 14 from the electrical output 54 of the optical transversal filter 50 and mixes it with a second chirp signal 294 supplied by a second chirp signal source 282. The second chirp signal 294 has a slope opposite that of chirp signal 94 from chirp signal source 82. As may be appreciated, this achieves the standard multiply-convolve-multiply result.

Figure 7:
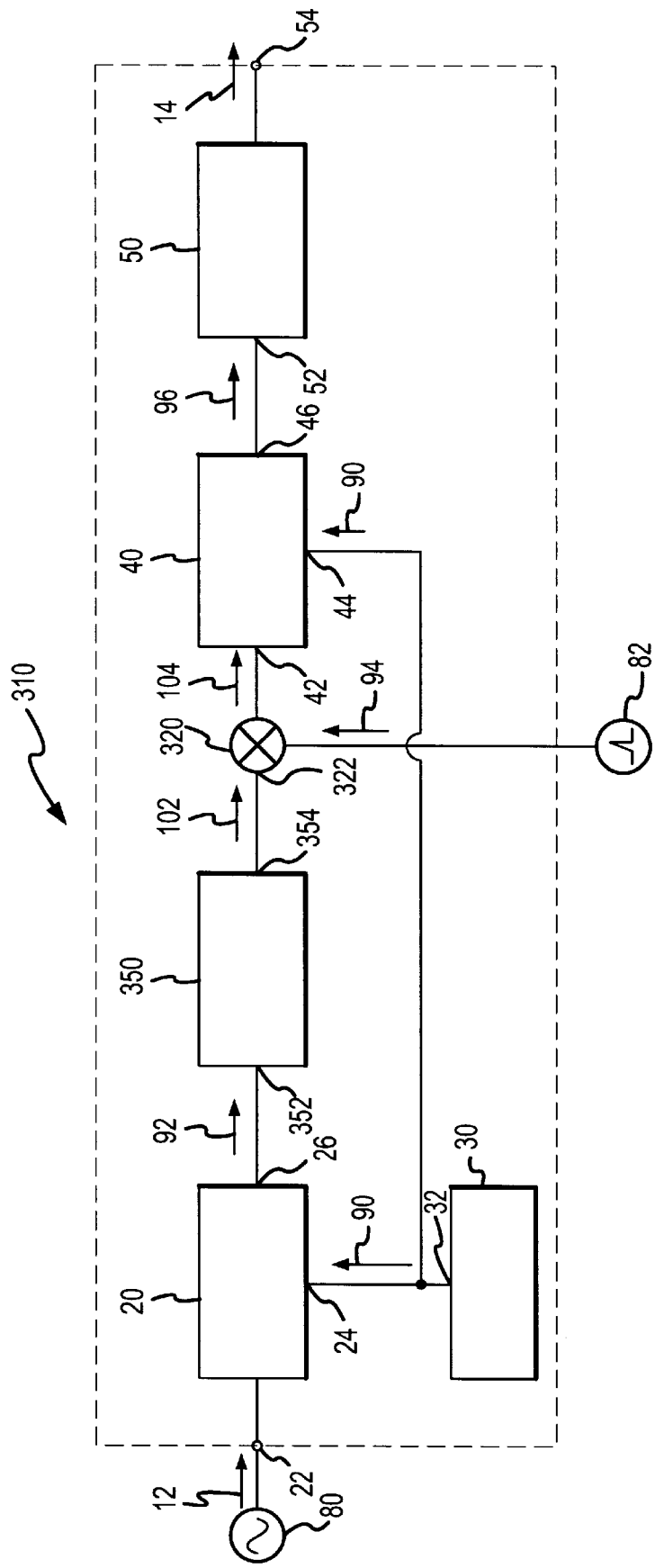
FIG. 7 is a schematic diagram of a further embodiment of a wideband frequency analyzer in accordance with the present invention.

Referring now to FIG. 7, there is shown a schematic diagram of a further embodiment of a wideband frequency analyzer 310 in accordance with the present invention. The wideband frequency analyzer 310 of FIG. 7 is configured to obtain the convolve-multiply-convolve result by including a second optical transversal filter 350 and an electrical signal mixer 320 between the first electro-optic modulator 20 and the second electro-optic modulator 40. The optical output 26 of the first electro-optic modulator 20 is optically connected to an optical input 352 of the second optical transversal filter 350. The second optical transversal filter 350 may, for example, be configured as shown in FIGS. 2, 4 or 5, and its electrical output 354 is electrically connected to an electrical input 322 of the electrical signal mixer 320. The second optical transversal filter 350 receives the modulated optical signal 92 and outputs a filtered modulated electrical signal 102 on its electrical output 354. The filtered modulated electrical signal 102 is mixed with a chirp signal 94 from a chirp signal source 82 by the electrical signal mixer 320. The electrical signal mixer 320 outputs a chirped modulated electrical signal 104 to the electrical input 42 of the second electro-optic modulator 40. The second electro-optic modulator 40 then modulates the chirped filtered electrical signal 104 onto an optical carrier signal 90 supplied to its optical input 44 to output the chirped modulated optical signal 96. In this regard, the optical carrier signal 90 from the optical signal source 30 may be split in order to supply the optical carrier signal 90 to the optical inputs 24, 44 of the first and second electro-optic modulators 20, 40. The chirped modulated optical signal 96 is then filtered by optical transversal filter 50 to output the output signal 14.

Figure 8:
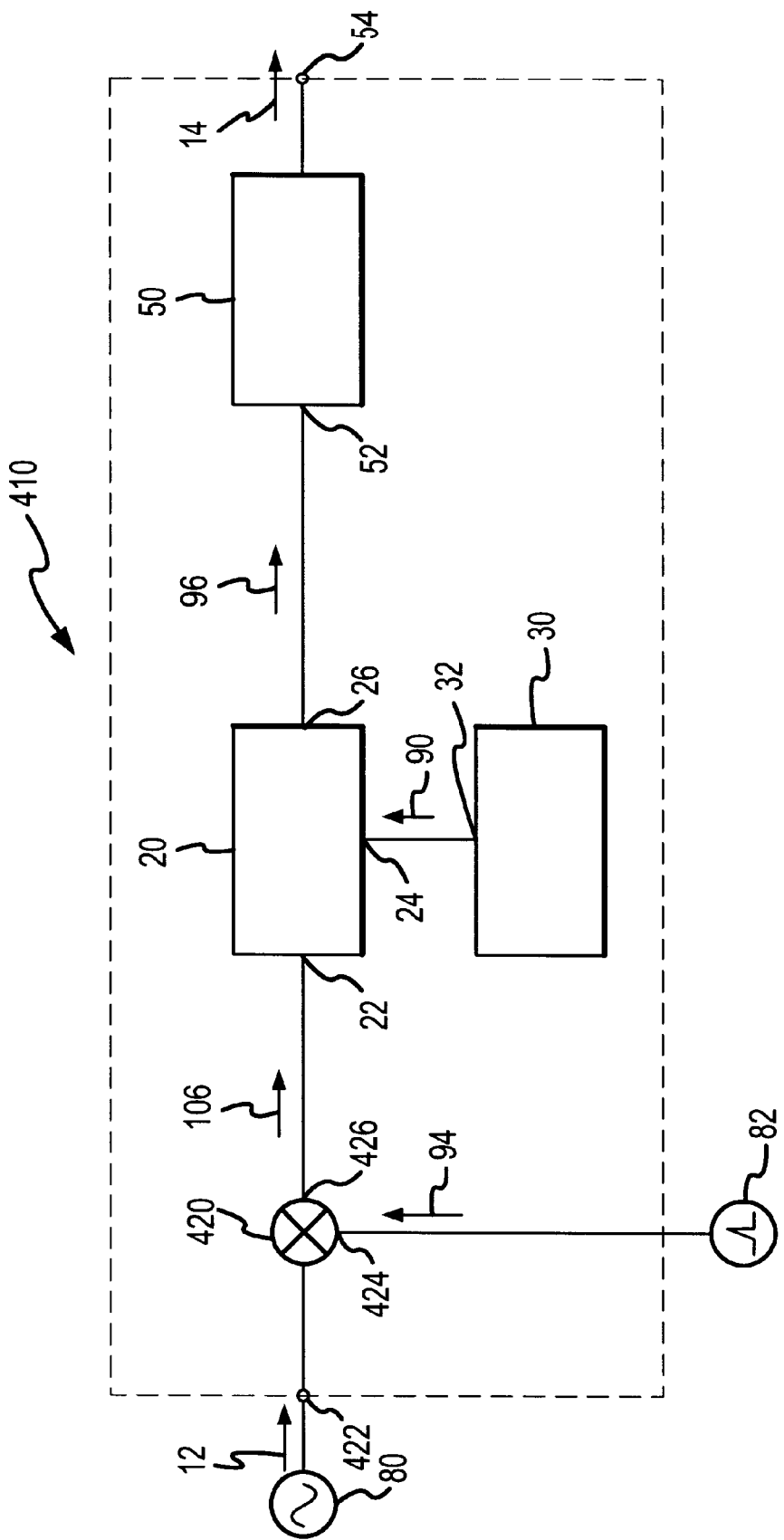
FIG. 8 is a schematic diagram of one more embodiment of a wideband frequency analyzer in accordance with the present invention.

Referring now to FIG. 8, one more embodiment of a wideband frequency analyzer 410 in accordance with the present invention is shown. The wideband frequency analyzer 410 of FIG. 8 is configured to mix the chirp signal 94 with the input signal 12 prior to modulation of the input signal 12 onto the optical carrier signal 90. In this regard, instead of including first and second electro-optic modulators 20,40, the alternatively configured wideband frequency analyzer 410 includes an electrical signal mixer 420 (e.g an RF mixer) and an electro-optic modulator 20. The electrical signal mixer 420 includes two electrical inputs 422, 424, one of which receives the input signal 12, and an electrical output 426 that is electrically connected to the electrical input 22 of the electro-optic modulator 20. The electrical signal mixer 420 receives the input signal 12 on electrical input 422 and mixes it with the chirp signal 94 received on electrical input 424 to output a chirped input signal 106 on electrical output 426 of the mixer 420. The electro-optic modulator 20 receives the chirped input signal 106 on its electrical input 22 and modulates the chirped electrical signal 106 onto the optical carrier signal 90 received on its optical input 24 from the optical carrier signal source 30 to output the modulated chirped optical signal 96 on its optical output 26. The optical transversal filter 50, which may, for example, be configured as described above in connection with FIGS. 2, 4 or 5, filters the modulated chirped optical signal 96 to output the output signal 14 representative of the amplitude of the Fourier transform of the input signal 12.

Figure 9:
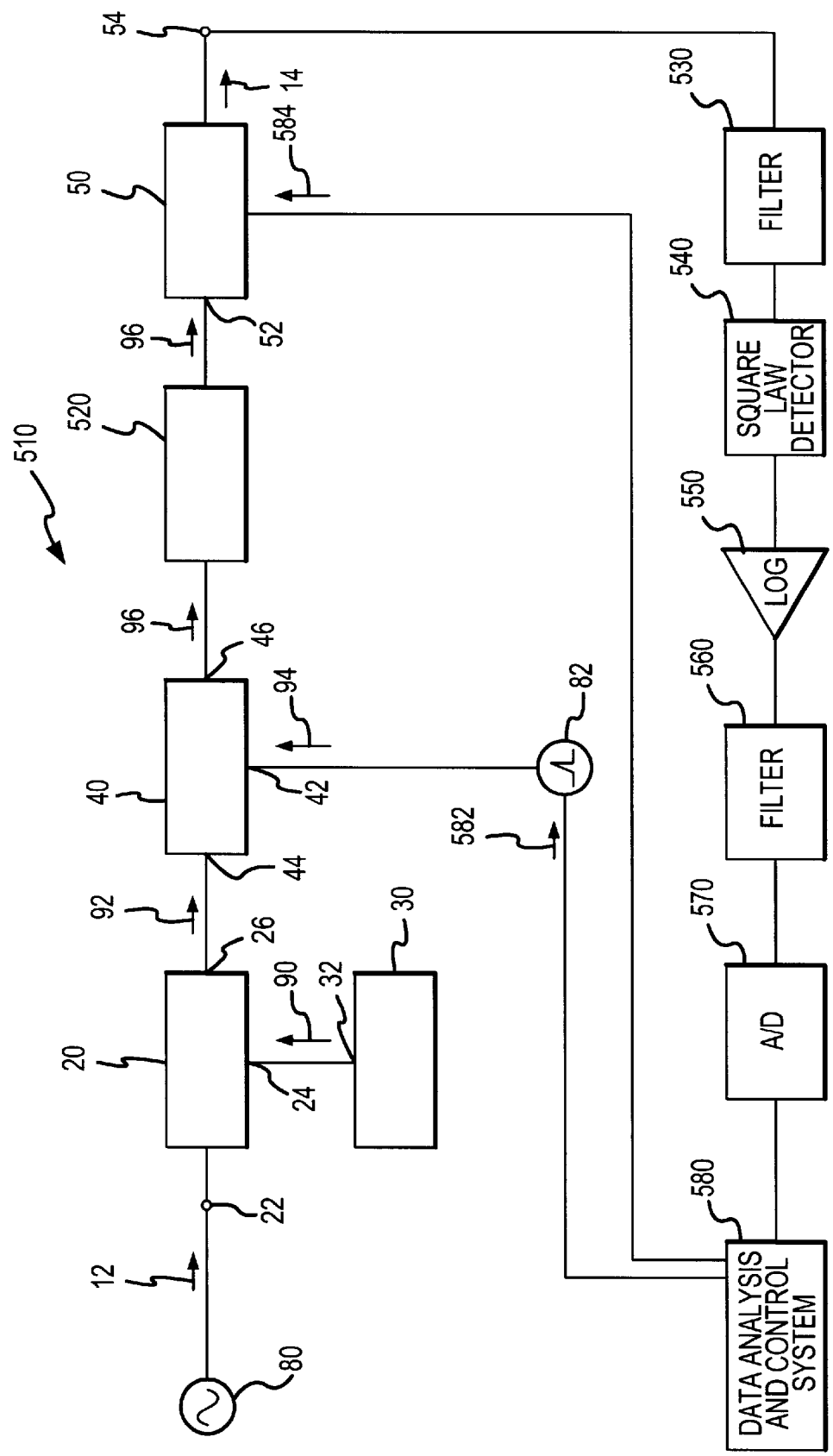
FIG. 9 is schematic diagram of an additional embodiment of a wideband frequency analyzer in accordance with the present invention.

Referring now to FIG. 9, there is shown a schematic diagram of an additional embodiment of a wideband frequency analyzer 510 in accordance with the present invention. In this embodiment, the wideband frequency analyzer 510 includes an optical signal amplifier 520 between the optical output 46 of the second electro-optic modulator 40 and the optical input 52 of the optical transversal filter 50. The optical signal amplifier 520 may, for example, comprise an erbium doped fiber amplifier. The optical signal amplifier 520 amplifies the chirped modulated optical signal 96 before it undergoes losses in the optical transversal filter 50 thereby enhancing performance of the wideband frequency analyzer 510. Such amplification of the chirped modulated optical signal 96 may be particularly useful when the optical transversal filter 50 includes a tapped optical fiber delay line 56 having many optical taps 62 (e.g. three to four hundred) or a branched optical fiber delay line 70 with many optical branches 72 (e.g. three to four hundred).

The schematic diagram of the wideband frequency analyzer 510 of FIG. 9 also shows one manner in which the output signal 14 of the wideband frequency analyzer 510 may be processed. The output signal 14 may be band-limited with an first electrical signal filter 530, and the modulation envelope 110 may be detected with a square-law detector 540. The output of the square law detector 540 may be amplified with a log amplifier 550 and band-limited with a second electrical signal filter 560. The amplified, band-limited output of the square-law detector 540 may then be converted to a digital signal using an analog-to-digital converter 570. The digital output of the analog-to-digital converter 570 may then be analyzed and used by a digital data analysis and control system 580 (e.g. an appropriately programmed computer). The data analysis and control system 580 may output a control signal 582 to the chirp signal source 82 to electronically control the characteristics of the chirp signal 94 (e.g. bandwidth, frequency-versus-time slope) and also a control signal 584 to the optical transversal filter 50 to electronically control its characteristics (e.g. amplitude weighting of the taps 62).

Although the present invention has been described in several embodiments, various changes and modifications may be suggested to one skilled in the art. It is intended that the present invention encompass such changes and modifications that fall within the scope of the appended claims.

What is claimed is:

1. A wideband frequency analyzer comprising:
    a first electro-optic modulator operable to modulate an electrical input signal onto an optical carrier signal to output a modulated optical signal;
    a second electro-optic modulator operable to mix the modulated optical signal with an electrical chirp signal to output a chirped modulated optical signal; and
    an optical transversal filter operable to filter the chirped modulated optical signal to output an electrical output signal representing the amplitude of the Fourier transform of the input signal.

2. The wideband frequency analyzer of claim 1 wherein the electrical input signal comprises a wideband radio-frequency signal.

3. The wideband frequency analyzer of claim 1 wherein said first and second electro-optic modulators comprise Mach-Zehnder modulators.

4. The wideband frequency analyzer of claim 1 further comprising:
    an optical carrier signal source operable to supply the optical carrier signal to said first electro-optic modulator.

5. The wideband frequency analyzer of claim 4 wherein said optical carrier signal source comprises a laser.

6. The wideband frequency analyzer of claim 1 further comprising:
    a chirp signal source operable to supply the chirp signal to said second electro-optic modulator.

7. The wideband frequency analyzer of claim 1 wherein said optical transversal filter comprises:
    a tapped optical fiber delay line including a first end and a second end, wherein the chirped modulated optical signal is receivable at said first end and is transmittable there through towards said second end;
    a plurality of taps spaced apart from one another along said optical fiber delay line between said first and second ends thereof, each said tap obtaining a sample of the chirped modulated optical signal after a period of delay corresponding to the location of said tap along said optical fiber delay line; and
    a plurality of optical detectors for receiving the delayed samples of the chirped modulated optical signal from said taps and converting the samples to electrical signals comprising the output signal.

8. The wideband frequency analyzer of claim 7 wherein the chirp signal has a time duration at least twice that of the longest period of delay provided by said optical transversal filter and a bandwidth at least twice the bandwidth provided by said optical transversal filter.

9. The wideband frequency analyzer of claim 7 wherein said optical fiber delay line comprises a single mode optical fiber.

10. The wideband frequency analyzer of claim 7 wherein said taps comprise fiber 1% (nominal) couplers with fiber pigtails.

11. The wideband frequency analyzer of claim 7 wherein said detectors comprise PIN diodes that are reverse biased.

12. The wideband frequency analyzer of claim 7 wherein there is a separate optical detector associated with each said tap, and wherein said electrical signals from said detector associated with said tap nearest said first end of said optical fiber delay line and said detectors associated with every second subsequent said tap thereafter along said optical fiber delay line are summed to produce a positive output signal, and wherein said electrical signals from said detector associated with said tap that is second nearest said first end of said optical fiber delay line and said detectors associated with every second subsequent said tap thereafter along said optical fiber delay line are summed to produce a negative output signal, and wherein said positive and negative output signals are summed to produce said output signal.

13. The wideband frequency analyzer of claim 7 wherein said taps are spaced apart from one another along said optical fiber delay line in a manner corresponding to positive and negative half-wave positions of a modulation envelope of the chirp signal modulated on the optical carrier signal.

14. The wideband frequency analyzer of claim 7 wherein there are first and second optical detectors, and wherein said first optical detector receives samples from said tap nearest said first end of said optical fiber delay line and every second subsequent said tap thereafter along said optical fiber delay line and said second detector receives samples from said tap that is second nearest said first end of said optical fiber delay line and said detectors associated with every second subsequent said tap thereafter along said optical fiber delay line.

15. The wideband frequency analyzer of claim 1 wherein said optical transversal filter comprises:
    a branched optical fiber delay line including a first end and a plurality of optical branches having separate ends thereof, wherein the chirped modulated optical signal is received at said first end and split among said optical branches to obtain samples of the chirped modulated optical signal at said end of each said optical branch after a period of delay corresponding to the distance between said end of each said optical branch and said first end; and
    a plurality of optical detectors for receiving the delayed samples of the chirped modulated optical signal from said ends of said optical branches and converting the samples to electrical signals comprising the output signal.

16. The wideband frequency analyzer of claim 1 further comprising:
    an electrical signal mixer operable to mix the electrical output signal from said optical transversal filter with a chirp signal having a slope opposite that of the chirp signal mixed with the modulated optical signal by said second electro-optic modulator.

17. The wideband frequency analyzer of claim 1 further comprising:
    a second optical transversal filter operable to filter the modulated optical signal to output a filtered electrical signal; and
    an electrical signal mixer operable to mix the filtered electrical signal with an electrical chirp signal to output a chirped filtered electrical signal;
    and wherein said second electro-optic modulator is operable to modulate the chirped filtered electrical signal onto an optical carrier signal to output the chirped modulated optical signal.

18. A wideband frequency analyzer comprising:
    an electrical signal mixer operable to mix an electrical input signal with an electrical chirp signal to output a chirped input signal;
    an electro-optic modulator operable to modulate the chirped input signal onto an optical carrier signal to output a chirped modulated optical signal; and
    an optical transversal filter operable to filter the chirped modulated optical signal to output an electrical output signal representing the amplitude of the Fourier transform of the input signal.

19. The wideband frequency analyzer of claim 18 wherein the electrical input signal comprises a wideband radio-frequency signal.

20. The wideband frequency analyzer of claim 18 wherein said electro-optic modulator comprises a Mach-Zehnder modulator.

21. The wideband frequency analyzer of claim 18 further comprising:
    an optical carrier signal source operable to supply the optical carrier signal to said electro-optic modulator.

22. The wideband frequency analyzer of claim 21 wherein said optical carrier signal source comprises a laser.

23. The wideband frequency analyzer of claim 18 further comprising:
    a chirp signal source operable to supply the chirp signal to said electrical signal mixer.

24. A method of performing spectral analysis of a wideband signal, said method comprising the steps of:
    modulating the wideband signal onto an optical carrier signal to generate a modulated optical signal;
    mixing the modulated optical signal with a chirp signal to generate a chirped modulated optical signal; and
    filtering the chirped modulated optical signal to generate an electrical output signal representative of the amplitude of the Fourier transform of the electrical input signal.

25. The method of claim 24 wherein said step of modulating comprises the steps of:
    supplying an optical carrier signal to an optical input of an electro-optic modulator;
    receiving the wideband signal on an electrical input of the electro-optic modulator; and
    operating the electro-optic modulator to output the modulated optical signal on an optical output of the electro-optic modulator.

26. The method of claim 24 wherein said step of mixing comprises:
    supplying an electrical chirp signal to an electrical input of an electro-optic modulator;
    receiving the modulated optical signal on an optical input of the electro-optic modulator; and
    operating the electro-optic modulator to output the chirped modulated optical signal on an optical output of the electro-optic modulator.

27. The method of claim 24 wherein said step of filtering comprises the steps of:
    transmitting the chirped modulated optical signal through an optical fiber delay line;
    sampling the chirped modulated optical signal at various locations along the optical fiber delay line to obtain samples of the chirped modulated optical signal; and converting the samples of the chirped modulated optical signal to electrical signals with optical detectors, wherein the electrical signals comprise the output signal.

28. An optical transversal filter comprising:

a tapped optical fiber delay line including a first end and a second end, wherein an optical signal to be filtered is receivable at said first end and is transmittable there through towards said second end;

a plurality of taps spaced apart from one another along said optical fiber delay line between said first and second ends thereof, each said tap obtaining a sample of the optical signal after a period of delay corresponding to the location of said tap along said optical fiber delay line; and a plurality of optical detectors for receiving the delayed samples of the optical signal from said taps and converting the samples to electrical signals comprising an output signal of said filter.

29. An optical transversal filter comprising:

a branched optical fiber delay line including a first end and a plurality of optical branches having separate ends thereof, wherein an optical signal to be filtered is receivable at said first end and split among said optical branches to obtain samples of the optical signal at said end of each said optical branch after a period of delay corresponding to the distance between said end of each said optical branch and said first end; and a plurality of optical detectors for receiving the delayed samples of the optical signal from said ends of said optical branches and converting the samples to electrical signals comprising an output signal of said filter.

\* \* \* \* \*

UNITED STATES PATENT AND TRADEMARK OFFICE
CERTIFICATE OF CORRECTION

PATENT NO.    : 6,307,655 B1
DATED         : October 23, 2001
INVENTOR(S)   : Jelks It is certified that error appears in the above-identified patent and that said Letters Patent is hereby corrected as shown below:

Title page,
Item [73], delete the word "Lockhead" and insert therefor -- Lockheed --.

Signed and Sealed this

Ninth Day of April, 2002

Attest:

Attesting Officer

JAMES E. ROGAN
*Director of the United States Patent and Trademark Office*